United States Patent [19]

Ye et al.

[11] Patent Number: 5,817,534

[45] Date of Patent: Oct. 6, 1998

[54] RF PLASMA REACTOR WITH CLEANING ELECTRODE FOR CLEANING DURING PROCESSING OF SEMICONDUCTOR WAFERS

[75] Inventors: Yan Ye, Campbell; Hiroji Hanawa, Sunnyvale; Diana Xiaobing Ma, Saratoga; Gerald Zheyao Yin, Cupertino; Peter Loewenhardt, San Jose; Donald Olgado, Palo Alto; James Papanu, San Rafael; Steven S.Y. Mak, Pleasanton, all of Calif.

[73] Assignee: Applied Materials, Inc., Santa Clara, Calif.

[21] Appl. No.: 567,376

[22] Filed: Dec. 4, 1995

[51] Int. Cl.$^6$ ................................................ H05H 1/00
[52] U.S. Cl. .......................... 438/10; 438/13; 438/905; 438/729; 438/758; 134/1.1; 134/1.2; 216/61; 216/71
[58] Field of Search ................................ 438/905, 584, 438/10, 13, 710, 711, 729, 758; 134/1.1, 1.2; 118/723 I; 156/345 C; 216/61, 71

[56] References Cited

U.S. PATENT DOCUMENTS

| | | |
|---|---|---|
| 5,006,192 | 4/1991 | Deguchi . |
| 5,057,185 | 10/1991 | Thomas, III et al. .................. 156/643 |
| 5,252,178 | 10/1993 | Moslehi . |
| 5,269,881 | 12/1993 | Sekiya et al. . |
| 5,425,842 | 6/1995 | Zijlstra ................................. 438/905 |
| 5,464,499 | 11/1995 | Moslehi et al. ........................ 438/905 |
| 5,468,686 | 11/1995 | Kawamoto ............................. 438/905 |
| 5,514,246 | 5/1996 | Blalock ................................. 438/905 |
| 5,523,261 | 6/1996 | Sandhu ................................. 438/905 |
| 5,585,012 | 12/1996 | Wu et al. .............................. 216/71 |

FOREIGN PATENT DOCUMENTS

| | | |
|---|---|---|
| 0 680 072 A | 2/1995 | European Pat. Off. . |
| 1-8625 | 1/1989 | Japan ................................... 216/61 |

Primary Examiner—Charles L. Bowers, Jr.
Assistant Examiner—Matthew Whipple
Attorney, Agent, or Firm—Michaelson & Wallace

[57] ABSTRACT

The invention is carried out in a plasma reactor for processing a semiconductor wafer, the plasma reactor having a chamber for containing a processing gas and having a conductor connected to an RF power source for coupling RF power into the reactor chamber to generate from the processing gas a plasma inside the chamber, the chamber containing at least one surface exposed toward the plasma and susceptible to contamination by particles produced during processing of the wafer, the invention being carried out by promoting, during processing of the wafer, bombarding of particles from the plasma onto the one surface to remove therefrom contaminants deposited during processing of the wafer. Such promoting of bombarding is carried out by providing an RF power supply and coupling, during processing of the wafer, RF power from the supply to the one surface. The coupling may be performed by a capacitive cleaning electrode adjacent the one surface, the capacitive cleaning electrode connected to the RF power supply. The capacitive cleaning electrode preferably is disposed on a side of the one surface opposite the plasma so as to be protected from contact with the plasma. Alternatively, the coupling may be carried out by a direct electrical connection from the RF power supply to the one surface.

23 Claims, 4 Drawing Sheets

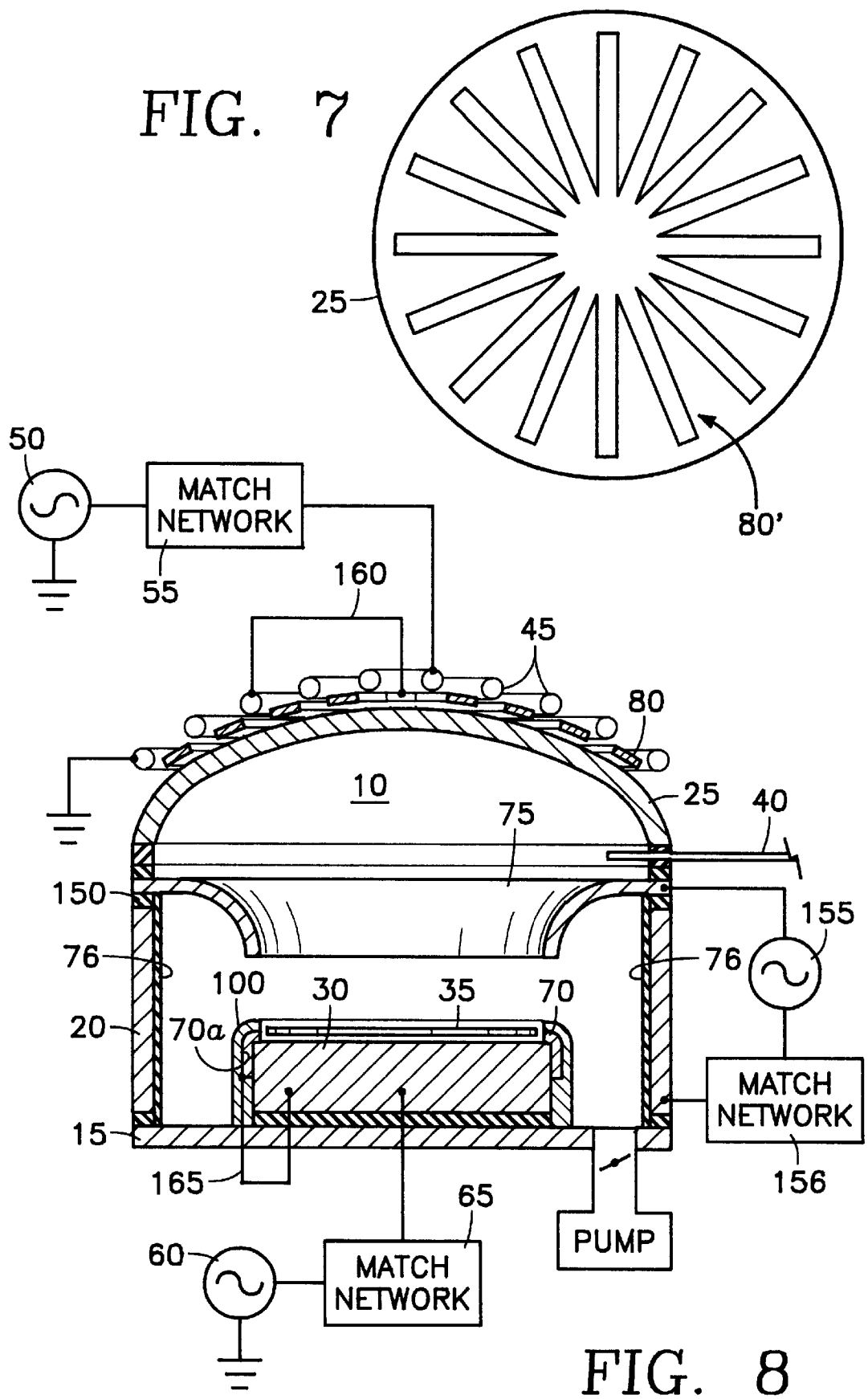

RF PLASMA REACTOR WITH CLEANING ELECTRODE FOR CLEANING DURING PROCESSING OF SEMICONDUCTOR WAFERS

BACKGROUND OF THE INVENTION

1. Technical Field:

The invention is related to a method and apparatus for cleaning a plasma reactor during processing of a semiconductor wafer.

2. Background Art:

Many semiconductor wafer fabrication processes carried out in RF plasma reactors leave contaminant deposits on the reactor chamber walls, which accumulate and become the source of particulate matter harmful to the creation of a semiconductor device. With the dramatic reduction in device sizes of microcircuit elements formed on semiconductor wafers, susceptibility to device failure due to contaminant particle deposition on the wafer has increased.

Particulate contaminant deposit buildup on semiconductor process chamber walls can be particularly significant when metal etching processes are carried out in the chamber. In particular, the etching of an aluminum pattern produces relatively large accumulations of such contaminant buildup. These aluminum films are generally etched by employing a number of reactive gases, including halogen and halocarbon gases, as plasma components. More specifically, the etched gases used are predominantly the chlorine containing gases, chlorine and boron trichloride, which enables formation of volatile aluminum chloride compounds upon etching, which volatile compounds can be removed from the etch processing chamber by applied vacuum. However, simultaneously with the formation of volatile aluminum chloride compounds, other active chlorine-containing and boron-containing species are formed which can react with any oxygen and water vapor present in the etch processing chamber or with organic species from patterning photoresist to form non-volatile particulate compositions which ultimately produce relatively large quantities of contaminants on the inner wall surfaces of the process chamber. These nonvolatile particulate compositions initially tend to remain deposited inside the etch chamber in the form of loosely attached particles to the elements and interior surfaces of the chamber. The loosely attached deposits can easily flake and break free of the surface to which they are attached and fall upon a wafer surface, causing contamination and resulting in a defective wafer workpiece. Further, as time progresses, the nonvolatile particulate deposits combine with polymeric materials generated from photoresist and carbon-containing etchant gases (by-products of the etch process) and accumulate to form a contaminant deposit on the side walls and other interior surfaces of the etch process chamber. Accumulation of such contaminants on the chamber walls increases the likelihood of contamination of the semiconductor workpiece during processing. To avoid processing of potentially defective wafers under these conditions, the chamber must be shut down periodically to perform a major cleaning operation.

Known plasma chamber cleaning methods have involved opening the plasma etch chamber, disassembling portions of the chamber, and removing the contaminant deposits by physical or chemical methods. For example, the chamber can be rinsed with a solution of hydrochloric acid, or hands wiped with a solvent, to dissolve various contaminants. The etch chamber alternatively may be washed with water and dried. The same cleaning techniques are applied to the vacuum exhaust channels and pump system because diminished vacuum or suffocation will occur in the event of accumulated residue or contaminant clogging. All of these cleaning methods are complicated, disruptive, time consuming, and can be the source of additional contamination. Moreover, such a major cleaning process can take up to 24 hours of lost production time for large plasma reactors and therefore represent an inordinate expense.

In a plasma-enhanced dry cleaning process, contaminants attached to the inside walls of a metal etch reaction chamber are removed by plasma etching using carbon tetrachloride and oxygen. However, presently known plasma-enhanced dry cleaning systems require a dry cleaning time period equal to about 5% to 10% of the time spent in the metal etching process itself. Moreover, while present prior art chamber cleaning processes employ plasma etch halogenated gases, they generally employ an oxidizing agent as well. Such oxidizing agents or oxygenated compounds have certain disadvantages. For example, metal etch dry cleaning recipes which include halogenated compounds and oxygen or oxygen-containing gases have been found unsatisfactory because of formation in the chamber of powdery aluminum oxyhalide by-products which are also contaminants.

It is an object of the invention to clean the reactor simultaneously with the processing of the wafer, using the same gases employed in processing the wafer to clean the chamber.

SUMMARY OF THE INVENTION

The invention is carried out in a plasma reactor for processing a semiconductor wafer, the plasma reactor having a chamber for containing a processing gas and having a conductor connected to an RF power source for coupling RF power into the reactor chamber to generate from the processing gas a plasma inside the chamber, the chamber containing at least one surface exposed toward the plasma and susceptible to contamination by particles produced during processing of the wafer, the invention being carried out by promoting, during processing of the wafer, bombarding of particles from the plasma onto the one surface to remove therefrom contaminants deposited during processing of the wafer. Such promoting of bombarding is carried out by providing an RF power supply and coupling, during processing of the wafer, RF power from the supply to the one surface.

The coupling may be performed by a capacitive cleaning electrode adjacent the one surface, the capacitive cleaning electrode connected to the RF power supply. The capacitive cleaning electrode preferably is disposed on a side of the one surface opposite the plasma so as to be protected from contact with the plasma. Alternatively, the coupling may be carried out by a direct electrical connection from the RF power supply to the one surface.

Typically, contamination of the one surface occurs at a particular deposition rate, and it is preferred that there be an adjusting of the RF power applied to the capacitive cleaning electrode to a level corresponding to a bombarding rate at the one surface which at least nearly offsets the particular deposition rate.

In one embodiment, RF power applied to the capacitive electrode is of a frequency lower than that of the RF power source connected to the conductor.

In another embodiment, the RF power applied to the capacitive cleaning electrode is of a phase different from that applied to the conductor, whereby bombarding particles are consumed from the plasma for cleaning the one surface at times different from when bombarding particles are consumed from the plasma for bombarding the wafer.

The RF power applied to the capacitive cleaning electrode may be adjusted by sensing whether the bombarding rate at the one surface offsets the rate of deposition of particles on the one surface and increasing the RF power applied to the capacitive cleaning electrode whenever the bombarding rate falls below the deposition rate. Furthermore, the RF power on the capacitive cleaning electrode may be limited to avoid ablating the one surface. The plasma has a characteristic RF impedance which changes with accumulation of deposited particles from plasma on the one surface, and sensing whether the bombarding rate offsets the rate of deposition includes sensing a change in the RF impedance of the plasma.

Adjustment of the RF power on the capacitive cleaning electrode may be automatically adjusted by a feedback processor including (a) an input at which a reactance of the variable reactive element of the RF impedance match network of the plasma source power supply or plasma bias supply is periodically sensed, and (b) an output connected to a power level control input of the RF generator driving the capacitive cleaning electrode, the feedback processor producing an error signal at the output corresponding to changes in reactance of the variable reactive element of the RF impedance match network.

The reactor includes a wafer support pedestal in the chamber, the chamber includes a ceiling overlying the wafer support pedestal, and the one surface includes an interior surface of the ceiling, and the capacitive cleaning electrode includes a thin conductive layer adjacent an exterior surface of the ceiling. The conductor may be an inductive antenna adjacent the exterior surface of the ceiling, the thin conductive layer being closer to the ceiling than the inductive antenna. In this case, the thin conductive layer includes plural apertures for permitting inductive coupling of RF power from the inductive antenna through the thin conductive layer into the chamber. The thin conductive layer may includes plural arms separated by the apertures and joined at a central apex from which they radiate in a star-shaped pattern.

Alternatively, the capacitive cleaning electrode may be a conductive layer on an interior surface of a focus ring surrounding the wafer on the wafer pedestal.

In order to clean the chamber side wall, the reactor may further include an RF power source to the side wall for promoting bombarding of contaminant deposits from the side wall.

The cleaning RF power supply connected to the capacitive cleaning electrode near the ceiling may have an RF frequency less than that of the plasma RF source power supply connected to the inductive antenna.

The RF power source connected to the capacitive cleaning electrode may be of a different phase than the source of RF power connected to the inductive antenna whereby to attract bombarding particles from the plasma to the wafer and to the one surface at different times.

BRIEF DESCRIPTION OF THE DRAWINGS

FIG. 7 is a top view of the capacitive cleaning electrode pattern on the ceiling of the reactor of the embodiment of FIG. 3.

FIG. 8 is a side view of a third embodiment of the invention.

DETAILED DESCRIPTION OF THE PREFERRED EMBODIMENTS

Figure 1:
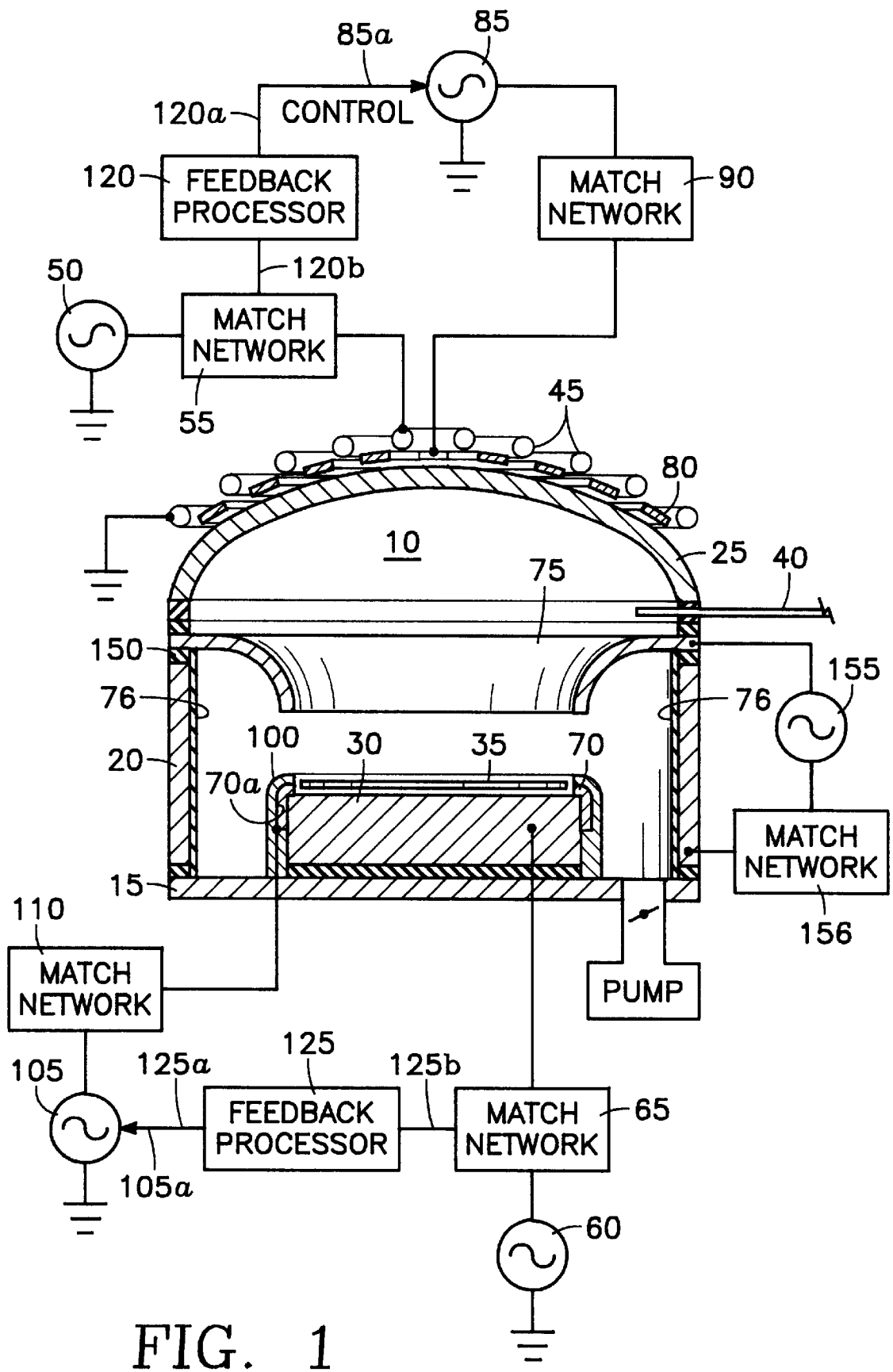
FIG. 1 is a side view of a first embodiment of the invention.

Referring to FIG. 1, a plasma reactor includes a vacuum chamber 10 defined by an enclosure wall 15 including a cylindrical side wall 20 and a dome-shaped ceiling 25. It should be understood that the present invention described in detail hereinafter is not limited to any particular ceiling shape but is applicable to reactor chamber ceilings other than the dome-shaped ceiling illustrated in FIG. 1. A wafer pedestal 30 supports a semiconductor wafer 35 to be processed. A gas inlet 40 furnishes plasma precursor gas into the chamber 10. An inductive antenna 45 is disposed over the ceiling 25. In this particular case the inductive antenna 45 is a helically wound conductive coil, although other types of inductive antennas may be employed in carrying out the present invention . An RF plasma source power generator 50 is connected through a conventional RF impedance match network 55 to the inductive antenna 45. An RF bias power generator 60 is connected through another conventional RF impedance match network 65 to the wafer pedestal 30. Processing of the wafer 35 is enhanced by a plasma focus ring 70 overlying the corner of the wafer pedestal 30 and surrounding the wafer 35. Processing of the wafer 35 is further enhanced by a gas distribution ring 75 separating the upper portion of the chamber 10 from the lower portion thereof. The present invention may be carried out with or without the focus ring 70 or the gas distribution ring 75. Instead, an RF-powered conductive cylindrical chamber liner 76 (indicated in dashed line) may be provided adjacent the interior of the sidewall 20 but insulated therefrom. The RF power applied to the chamber liner 76 may be a frequency different from the source power and bias power.

As discussed previously herein, the productivity or throughput of a plasma reactor of the type illustrated in FIG. 1 is limited by the necessity of periodically interrupting wafer processing to clean the interior of the chamber and remove therefrom plasma processing by-product contaminants which accumulate on interior surfaces of the chamber during plasma processing of the wafer. Such contaminants are formed by interaction between the plasma and materials on the wafer 35, as explained previously herein. For example, if the plasma reactor of FIG. 1 is employed to etch a metal thin film from the wafer, then a chlorine-containing processing gas is supplied through the chamber gas inlet 40. In one example, plasma source power on the order of between 200 and 1000 Watts at about 2.0 Mhz is applied to the coil inductor to generate a plasma while bias RF power of 13.56 Mhz and about half the source power is applied to the wafer pedestal to control the energy of the plasma ions near the wafer surface. The resulting chlorine-containing plasma interacts with photoresist layers patterned over the metal thin film on the wafer to form carbon-containing polymer chains which can polymerize on the chamber interior surfaces. If the plasma contains fluorine, then an aluminum fluoride contaminant is produced which, after accumulating on the chamber interior surfaces, is difficult to remove, and for this reason it is preferred not to employ fluorine in the plasma during wafer processing. However, when wafer processing operations are suspended during chamber cleaning, it is preferred to employ fluorine chemistry in order to speed up the cleaning process to an acceptable rate to minimize the time required to clean the reactor interior. Unfortunately, use of fluorine in the plasma during cleaning can still produce hard-to-remove aluminum fluoride contaminants if there are some aluminum resides in the chamber when the cleaning operation begins.

The present invention acts to clean the chamber interior surfaces during wafer processing, thereby reducing or eliminating the need to periodically interrupt wafer processing to perform the usual chamber cleaning operations. One advantage of the invention is that use of fluorine chemistry is not at all required to clean the chamber interior surfaces during wafer processing, thereby avoiding the formation of the hard-to-remove aluminum fluoride contaminants. Of course, the main advantage is that wafer processing need not be interrupted, or at least not as often as in the prior art, thereby greatly enhancing the productivity and throughput of the plasma reactor.

The invention cleans the interior chamber surfaces during wafer processing by eliminating or reducing contaminant deposition on the chamber interior surfaces during wafer processing. This is accomplished by creating, near the surface to be cleaned, an electric field which attracts heavy ions from the plasma so that they impinge on that surface to bombard or remove previously deposited contaminants at a rate corresponding to the rate at which such contaminants tend to be deposited otherwise during wafer processing. As a result, as the plasma processing by-product contaminants deposit onto the surface at a particular rate, they are bombarded off that surface ideally at the same rate or at least at a similar rate, so that there is little or no net accumulation of contaminants on the surface. Since the bombarding rate is determined by the magnitude of the electric field, the electric field is adjusted ideally until a precise balance is reached between contaminant deposition rate and bombarding rate.

Figure 2:
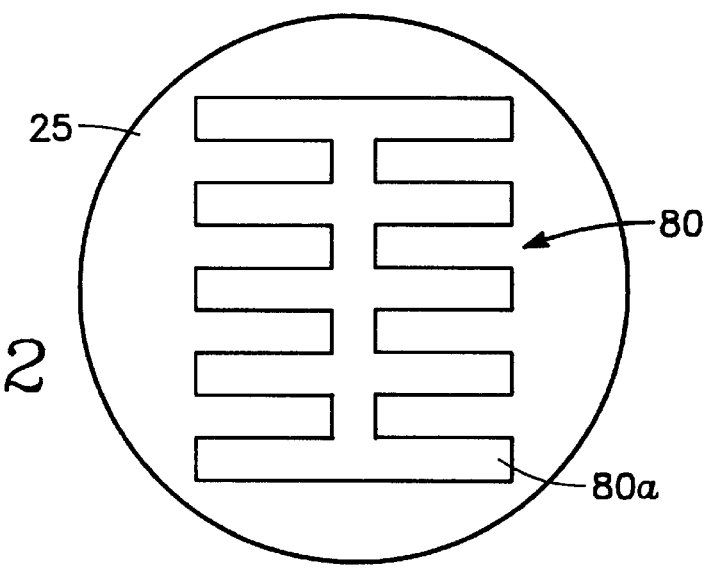
FIG. 2 is a top view of the capacitive cleaning electrode pattern on the ceiling of the reactor of the embodiment of FIG. 1.

For example, in order to clean the ceiling 25 during wafer processing, an RF-driven capacitive cleaning electrode 80 is placed over the outside surface of the ceiling 25. An RF bias potential applied to the capacitive cleaning electrode 80 attracts ions or radicals in the plasma toward the interior surface of the ceiling 25 so that they bombard the surface thereof and remove contaminant deposits therefrom. The capacitive cleaning electrode 80 of the embodiment of FIG. 1 consists of plural conductive strips 80a, best seen in the top view of FIG. 2, connected to a first cleaning RF power generator 85 through a conventional RF impedance match network 90. The conductive strips 80a may, in one implementation, be thin conductive adhesive strips stuck to the exterior surface of the ceiling 25. The spacing between adjacent strips 80a is sufficient to prevent the magnetic field of the inductive antenna from forming eddy currents in the capacitive cleaning electrode and permit the transmission of the RF magnetic field from the inductive antenna through the capacitive cleaning electrode. Alternatively, as will be described below with reference to FIG. 8, the capacitive cleaning electrode 80 may tap RF power from a selected winding of the inductive coil antenna 45, thus eliminating the need for a separate RF power source for the capacitive cleaning electrode 80.

Figure 3:
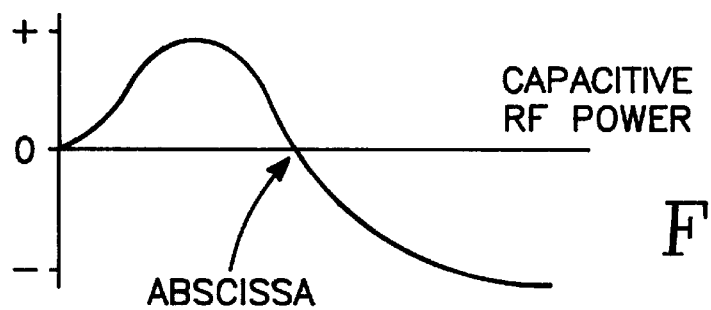
FIG. 3 is a graph depicting contaminant deposition rate on an interior chamber surface as a function of bias potential of the surface.

The RF power applied to the capacitive cleaning electrode 80 is preferably adjusted to achieve the requisite balance between contaminant deposition rate and bombarding rate, either by adjusting the RF power level of the separate RF generator 85 in the embodiment of FIG. 1 or by moving the coil tap in the embodiment of FIG. 8. How to reach the balance between deposition and bombarding rates is best understood by reference to FIG. 3, which illustrates the deposition rate (ordinate) as a function of the bias potential (abscissa) on the surface in question. The negative portion of the ordinate is a region of "negative" deposition, or, in other words, removal. This region is preferably avoided at all costs, since what is removed is all material including the underlying material of the surface itself, not merely the contaminants thereon. FIG. 3 shows that, at first, as the surface potential is increased from zero, the deposition rate increases. This is because some minimal kinetic energy is required to achieve a strong bond between the deposited particle and the material on the surface, and the kinetic energy increases with the bias potential. Thereafter, above a certain RF bias potential, the deposition rate falls off with increasing bias potential. This is because the corresponding increase in particle kinetic energy no longer enhances the deposition process but does increase the bombarding rate at which impacting particles knock off previously deposited particles. Thus, the bombarding process detracts from the deposition process. With even further increases in bias potential, the overall deposition rate continues to fall off until it finally reaches zero (where the curve intersects the abscissa), which is the ideal point at which the bombarding rate exactly matches the deposition rate. This is ideal because at this point there is no accumulation of contaminants. Further increases in bias potential result in a negative deposition rate, which is undesirable as pointed out above because the bombarding process begins to ablate the underlying materials of the chamber interior. Such materials would then be worn out quickly and are expensive to replace. Thus, the invention is preferably operated in the region near but at least slightly above (if not exactly on) the abscissa of FIG. 3. A trial-and-error method may be employed in varying the RF power applied to the capacitive cleaning electrode 80 until the ideal condition (offsetting deposition and bombarding rates) is attained. A technique for automatically maintaining this ideal condition is disclosed later in this specification.

The capacitive cleaning electrode 80 may be driven at a lower RF frequency than the RF source power applied to the inductive antenna.

As another example, if the exterior surface of the focus ring 70 is to be cleaned during wafer processing, then a capacitive cleaning electrode 100 may be placed on the interior surface 70a of the focus ring 70. The interior surface 70a is not exposed to the plasma. RF power is applied to the capacitive cleaning electrode 100 by an RF generator 105 through an RF impedance match network 110. Alternatively, the capacitive cleaning electrode can be connected directly to the wafer pedestal 30 so as to be powered by the bias generator 60, so that the separate RF generator 105 and match network 110 can be dispensed with, as will be described below with reference to FIG. 8. It is preferable, however, to independently drive the capacitive cleaning electrode 100 with the separate RF generator 105 so that the bombarding rate can be adjusted to precisely offset the contaminant deposition rate as described above with respect to FIG. 3 without changing the bias power level on the wafer from that required for optimum wafer processing.

Figure 4:
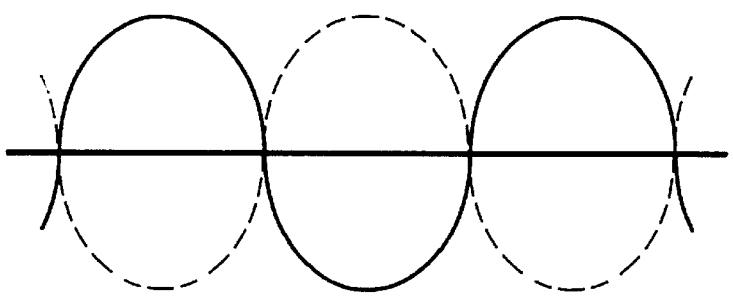
FIG. 4 is a graph depicting the time domain waveform of the bias RF voltage applied to the wafer pedestal (solid line) and RF voltage applied to the capacitive cleaning electrode on the focus ring around the wafer pedestal.

In order to prevent the cleaning electrode 100 disturbing the ideal wafer processing conditions, the RF power applied by the separate RF generator 105 to the capacitive cleaning electrode 100 has either a different phase or frequency from that applied to the wafer pedestal 30 by the RF generator 60. One manner in which operation of the capacitive cleaning electrode 100 can interfere with wafer processing in an etch reactor is to divert plasma ions and radicals away from the wafer surface and toward the surface to be protected (for example, the exterior surface of the focus ring 70). Such ions and radicals would otherwise be available for interacting with the wafer surface to enhance the etching processing. In order to reduce the effect on the wafer etch process of such a diversion of ions and radicals, the phase of the RF signal applied to the capacitive cleaning electrode 100 is made to be 180 degrees out of phase with the RF signal applied to the wafer pedestal. In this case the two signals are of the same frequency. As illustrated in FIG. 4, whenever the RF signal applied to the wafer pedestal 30 (solid line curve) is maximum positive, the RF signal on the capacitive cleaning electrode 100 (dashed line curve) is maximum negative, and vice versa. The result is that during the half-cycle of the bias signal on the wafer pedestal in which plasma ions and radicals are attracted toward the wafer surface to enhance the etch process, none are diverted by the capacitive cleaning electrode 100 toward the surface to be protected (the exterior surface of the focus ring 70). The capacitive cleaning electrode 100 diverts plasma ions and radicals away from the wafer surface (toward the focus ring 70) only during the other half cycle of the RF signal on the wafer pedestal which does not attract ions and radicals toward the wafer surface. Thus, the effect on the wafer etch process of a diversion of ions and radicals by the capacitive cleaning electrode 100 can be minimized.

As mentioned hereinabove, a trial and error method could be employed to determined the optimum RF power applied to the capacitive cleaning electrode (80 or 100). However, it would be more effective and convenient to do so automatically. This can be accomplished by taking advantage of the fact that whenever the contaminant deposition rate exceeds the bombarding rate set by the capacitive cleaning electrode, a net deposition of contaminants on interior chamber surfaces occurs, and the build-up of contaminants on interior chamber surfaces changes the RF plasma impedance. This of course results in the RF impedance match network automatically changing its internal impedance to follow the change in the plasma impedance. Thus, the performance of the capacitive cleaning electrode can be monitored by sensing changes in the RF impedance match network. For this purpose, in the case of the ceiling capacitive cleaning electrode 80 a feedback processor 120 controls the RF power level generated by the RF generator 85 by an output 120a of the processor 120 connected to a power level control input 85a of the RF generator 85, as illustrated in FIG. 1. The feedback processor 120 senses at an input 120b a reactance of a variable reactive component of the RF impedance match network 55. Whenever the RF impedance match network 55 senses a change in the plasma impedance, the feedback processor 120 causes a corresponding change in the output power level of the RF generator 85.

Similarly, in the case of the focus ring capacitive cleaning electrode 100, a feedback processor 125 controls the RF power level generated by the RF generator 105 by an output 125a of the processor 125 connected to a power level control input 105a of the RF generator 105, as illustrated in FIG. 1. The feedback processor 125 senses at an input 125b a reactance of a variable reactive component of the RF impedance match network 65. Whenever the RF impedance match network 65 senses a change in the plasma impedance, the feedback processor 125 causes a corresponding change in the output power level of the RF generator 105.

Preferably, in order to avoid operating the plasma cleaning electrode (80 or 100) in the negative region of the graph of FIG. 3 (where chamber components would themselves be deleteriously ablated away by the on-going bombarding process engendered by the capacitive cleaning electrode), a preferred embodiment of the feedback processor (120 or 125) constantly attempts to minimize the RF power level of the RF generator it controls (85 or 105) so that it is repeated notified by the action of the impedance match network (55 or 65) to restore the RF power level on the capacitive cleaning electrode. This keeps the bombarding rate near the optimum balance point at which it at least nearly offsets the contaminant deposition rate without risking crossover into the negative region of the graph of FIG. 3. Such a preferred embodiment of the feedback processor (120 or 125) can be implemented by the skilled worker using techniques known in the art.

Figure 5:
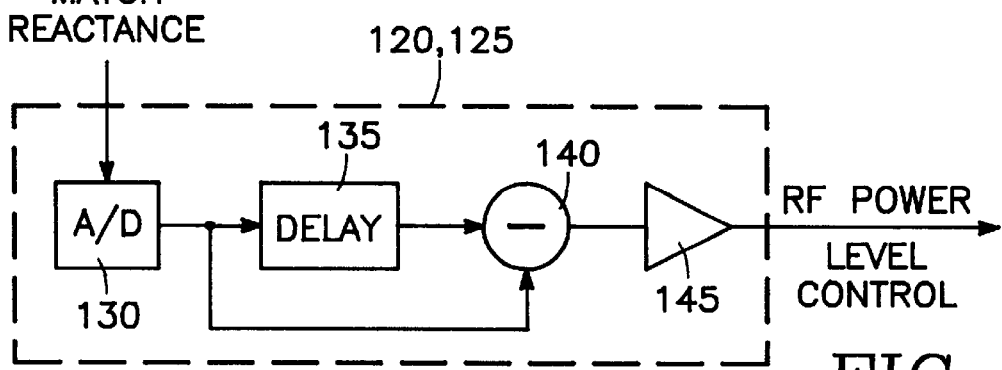
FIG. 5 is a simplified schematic diagram of a tutorial example of a processor for automatically adjusting the RF power level applied to a capacitive cleaning electrode of the invention.

However, a very simple version of the feedback processor which is not the preferred embodiment is illustrated in FIG. 5. In the highly unsophisticated feedback processor of FIG. 5, the reactance of the variable reactive element of the RF impedance match network is periodically sampled by an analog-to-digital converter 130. The output of the analog-to-digital converter is held in a delay or memory 135 for a delay time equal to the sampling period of the analog-to-digital converter 130. The delayed and undelayed output of the analog-to-digital converter 130 are subtracted by a subtractor 140. The difference produced by the subtractor 140 is appropriated scaled by an digital-to-analog converter 145 whose output is the command applied to the RF generator power level control input. Whenever the RF impedance match network changes its variable reactance element monitored by the feedback processor of FIG. 5 (indicating a change in the balance between contaminant deposition and bombarding rates), the subtractor 140 produces a proportionate error signal which produces a corresponding change in the RF power level applied to the capacitive cleaning electrode to counteract the change in the balance between contaminant deposition and bombarding rates.

As a further example, it may be desired to clean the cylindrical chamber side wall 20 during wafer processing. For this purpose the chamber side wall itself can serve as its own capacitive cleaning electrode. This is achieved, for example, by applying an RF bias potential across the gas distribution ring 75 and the chamber side wall 20. For this purpose, an insulating ring 150 is disposed between the gas distribution ring 75 and the chamber side wall 20, and an RF generator 155 is connected through an RF impedance match network 156 across the gas distribution ring 75 and the chamber side wall 20, as illustrated in FIG. 1. The methods discussed above for selecting the frequency or phase of the RF signal applied to the cleaning electrode and/or for automatically controlling its magnitude may be applied as desired to the RF signal applied to the chamber side wall 20 from the RF generator 155.

Figure 6:
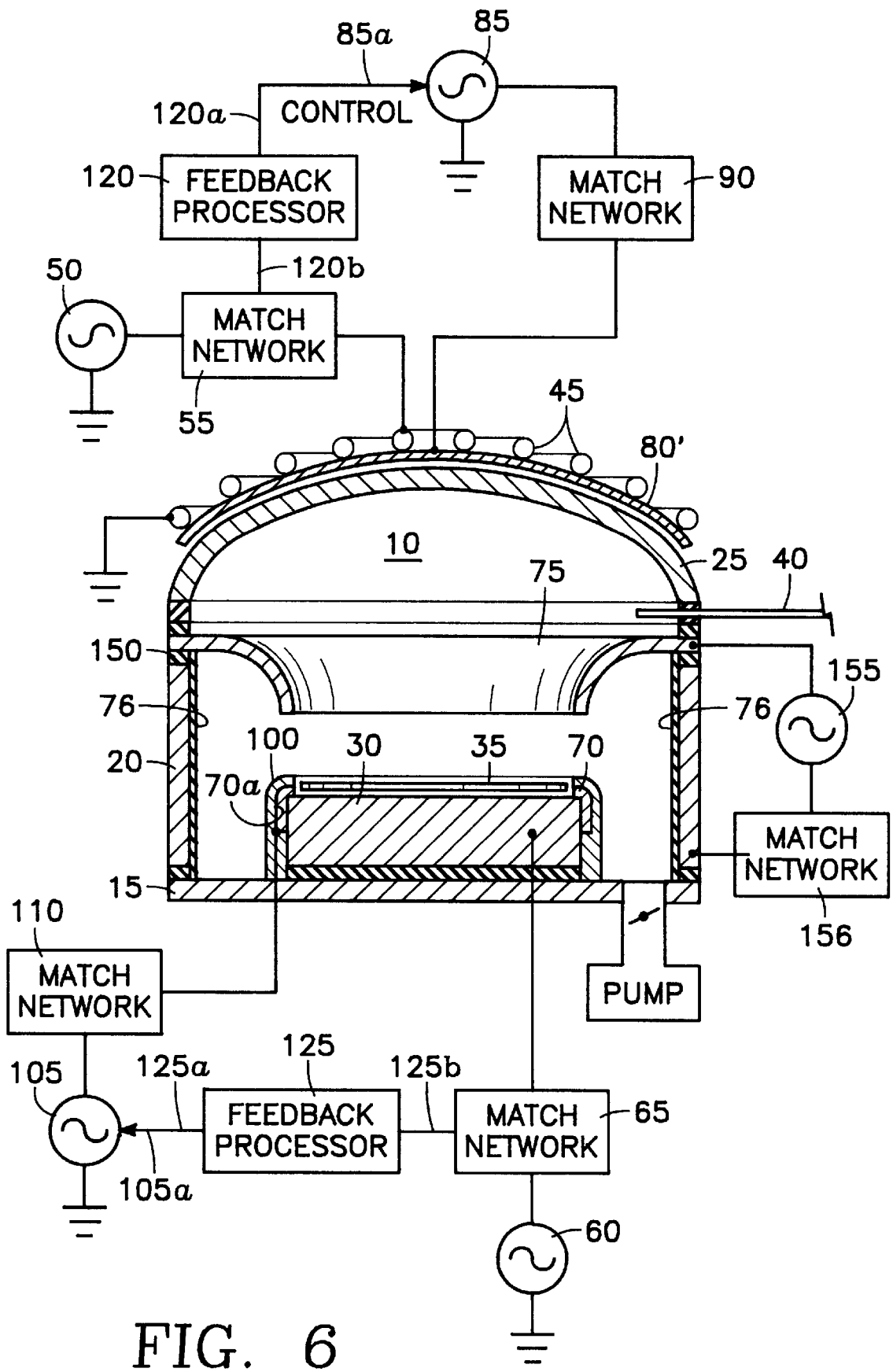
FIG. 6 is a side view of a second embodiment of the invention.

FIG. 6 illustrates the preferred embodiment of the invention, which is a plasma reactor corresponding to that described above with reference to FIG. 1, except that the ceiling capacitive cleaning electrode 80' of FIG. 6 is star-shaped, the center of the star shape coinciding with the center of the ceiling, as best seen in the top view of FIG. 7. One advantage of the embodiment of FIGS. 6 and 7 is that RF power is more evenly distributed over the surface of the ceiling by the star-shaped capacitive cleaning electrode 80' and is therefore preferred over the embodiment of FIG. 2.

FIG. 8 illustrates another embodiment of the invention in which the capacitive cleaning electrodes 80 and 100 share RF power with the inductive antenna and the wafer pedestal, respectively. This eliminates the need for the separate RF generators 85, 105 of FIG. 1. Instead, the capacitive cleaning electrode 80 receives its RF power from a tap 160 on a selected winding of the inductive antenna. Likewise, the capacitive cleaning electrode 100 receives its RF power through a contact 165 with the wafer pedestal. In the embodiment of FIG. 8, the RF power on the ceiling capacitive cleaning electrode 80 may be varied or selected by the varying position of the tap 160 on the inductive antenna.

In one working example of the embodiment of FIG. 1, the ceiling had a dome height of 10 cm and a diameter of 30 cm. The cylindrical side wall had a diameter of 30 cm and a height of 10 cm. The wafer pedestal held a 10 cm diameter wafer which was 14 cm below the apex of the dome ceiling. The capacitive cleaning electrode strips 80a on the ceiling were 10 cm wide separated by spaces on the order of 1.5 cm wide. The strips themselves were 0.5 cm thick. The RF source power applied to the inductive antenna was 1000 Watts at a frequency of 2.0 Mhz while the power applied to the cleaning electrode 80 was at a frequency of 2.0 Mhz. The capacitive cleaning electrode 100 on the focus ring 70 was a conductive strip 1.0 cm wide. The strip was 0.05 cm thick. The RF source power applied to the wafer pedestal was 200 Watts at a frequency of 13.56 Mhz while the power applied to the cleaning electrode 100 was at a frequency of 13.56 Mhz at a phase angle of 0 degrees relative to the RF power applied to the wafer pedestal.

While the invention has been described in detail by reference to preferred embodiments, it is understood that variations and modifications thereof may be made without departing from the true spirit and scope of the invention.

What is claimed is:

1. A method of processing a semiconductor wafer in a plasma reactor having a chamber containing a processing gas and having a conductor connected to an RF power source for coupling RF power into said reactor chamber to generate from said processing gas a plasma for processing said wafer, said chamber comprising at least one surface exposed toward said plasma and susceptible to contamination by particles produced during processing of the wafer, said method comprising:

providing a capacitive cleaning electrode adjacent said one surface, said capacitive cleaning electrode being disposed on a side of said one surface opposite said plasma so that said capacitive cleaning electrode is protected from contact with said plasma; and applying RF power to said capacitive cleaning electrode during processing of the wafer to reduce contamination of the one surface by said particles produced during processing of the wafer.

2. The method of claim 1 wherein said contamination of said one surface occurs at a particular deposition rate, said method further comprising adjusting said RF power applied to said capacitive cleaning electrode to a level corresponding to a bombarding rate at said one surface which at least nearly offsets said particular deposition rate.

3. The method of claim 1 wherein said RF power source connected to said conductor has a frequency sufficiently high to enable penetration of RF power from said conductor through said plasma to said wafer, and wherein the step of applying RF power to said capacitive electrode comprises applying RF power to said capacitive cleaning electrode of a frequency lower than that of said RF power source connected to said conductor, said lower frequency limiting penetration of RF power from said capacitive cleaning electrode through said plasma.

4. The method of claim 3 wherein said conductor couples plasma source power from a side of said chamber remote from said wafer, and wherein said lower frequency is sufficiently low to prevent penetration of RF power from said conductor to said wafer.

5. The method of claim 1 wherein said conductor is coupled to said wafer whereby said RF power source provides a bias power controlling bombarding of said wafer, and wherein the step of applying RF power to said capacitive electrode comprises applying RF power to said capacitive cleaning electrode at a phase different from that applied to said conductor, whereby bombarding particles are consumed from said plasma for cleaning said one surface at times different from when bombarding particles are consumed from said plasma for bombarding said wafer.

6. The method of claim 5 wherein said phase is opposite that applied to said conductor.

7. The method of claim 2 wherein the step of adjusting said RF power applied to said capacitive cleaning electrode comprises:

sensing whether the bombarding rate at said one surface offsets the rate of deposition of particles on said one surface;

increasing said RF power applied to said capacitive cleaning electrode whenever said bombarding rate falls below said deposition rate.

8. The method of claim 7 further comprising limiting said RF power to avoid ablating said one surface.

9. The method of claim 8 wherein the step of limiting comprises reducing said RF power applied to said capacitive electrode during intervals in which the step of increasing is not carried out.

10. The method of claim 7 wherein said plasma has a characteristic RF impedance which changes with accumulation of deposited particles from plasma on said one surface, and wherein the step of sensing whether the bombarding rate offsets the rate of deposition comprises sensing a change in the RF impedance of said plasma.

11. A method of processing a semiconductor workpiece in a plasma reactor, said plasma reactor having a chamber containing a processing gas and having a conductor connected to an RF power source for coupling RF power into said reactor chamber to generate from said processing gas a plasma inside said chamber, said chamber comprising at least one surface exposed toward said plasma and susceptible to contamination by contaminant particles produced during processing of the workpiece, said method comprising:

promoting, during processing of said workpiece, bombarding of charged particles from said plasma onto said one surface to remove therefrom said contaminant particles deposited during processing of said workpiece;

electronically sensing whether a rate at which said contaminant particles deposit onto said one surface exceeds a rate at which said contaminant particles deposited on said one surface are removed therefrom by said bombarding of charged particles; and increasing the rate said contaminant particles are removed from said one surface whenever said rate at which said contaminant particles deposit on said one surface significantly exceeds said rate at which charged particles are removed from said one surface.

12. The method of claim 11 wherein the step of increasing the rate said contaminant particles are removed from said one surface comprises limiting said rate increase to that which avoids ablating said one surface.

13. The method of claim 11 wherein said plasma has a characteristic RF impedance which changes with accumulation of deposited contamination particles onto said one surface, and wherein the step of electronically sensing whether the rate at which said contaminant particles deposit onto said one surface exceeds the rate at which said contaminant particles deposited on said one surface are removed therefrom comprises sensing a change in the RF impedance of said plasma.

14. The method of claim 11 wherein the step of promoting bombarding comprises:

applying RF power to said one surface via a second RF power source.

15. The method of claim 14 wherein said plasma reactor further comprises support pedestal for supporting said workpiece within the reactor chamber, said method further comprising the step of applying RF power to said support pedestal via a third RF power source to promote bombarding of charged particles from the plasma onto an exposed surface of said workpiece to facilitate the processing of the workpiece, and wherein the step of applying RF power to said one surface comprises:

applying RF power at a phase different from that applied to said support pedestal causing said charged particles to bombard the exposed surface of said workpiece at times different from when the charged particles bombard said one surface, thereby avoiding any significant interference with the processing of the workpiece.

16. The method of claim 15 wherein said phase of the RF power applied to the support pedestal is opposite the phase of the RF power applied to said one surface.

17. The method of claim 14 wherein the step of applying RF power to said one surface comprises applying RF power having a lower frequency than the RF power applied to said conductor, said lower frequency avoiding any significant interference with the processing of the workpiece.

18. The method of claim 11 wherein the step of promoting bombarding comprises:

providing a capacitive cleaning electrode adjacent said one surface; and applying RF power to said capacitive cleaning electrode during processing of the wafer via a second RF power source.

19. The method of claim 18 wherein said plasma reactor further comprises a support pedestal for supporting said workpiece within the reactor chamber, said method further comprising the step of applying RF power to said support pedestal via a third RF power source to promote bombarding of charged particles from the plasma onto an exposed surface of said workpiece to facilitate the processing of the workpiece, and wherein the step of applying RF power to said capacitive cleaning electrode comprises:

applying RF power at a phase different from that applied to said support pedestal causing said charged particles to bombard the exposed surface of said workpiece at times different from when the charged particles bombard said one surface, thereby avoiding any significant interference with the processing of the workpiece.

20. The method of claim 19 wherein said phase of the RF power applied to the support pedestal is opposite the phase of the RF power applied to said capacitive cleaning electrode.

21. The method of claim 18 wherein the step of applying RF power to said capacitive cleaning electrode comprises applying RF power having a lower frequency than the RF power applied to said conductor, said lower frequency avoiding any significant interference with the processing of the workpiece.

22. The method of claim 18 wherein the step of providing a capacitive cleaning electrode adjacent said one surface comprises disposing the capacitive cleaning electrode on a side of the one surface opposite said plasma so that the capacitive cleaning electrode is protected from contact with the plasma.

23. A method of cleaning a chamber of a plasma reactor containing a cleaning gas and having a conductor connected to an RF power source for coupling RF power into said reactor chamber to generate from said cleaning gas a plasma for cleaning said chamber, said chamber comprising at least one surface exposed toward said plasma and susceptible to contamination by particles produced during processing of a workpiece in said chamber, said method comprising:

providing a capacitive cleaning electrode adjacent said one surface, said capacitive cleaning electrode being disposed on a side of said one surface opposite said plasma so that said capacitive cleaning electrode is protected from contact with said plasma; and applying RF power to said capacitive cleaning electrode to reduce contamination of the one surface by said particles produced during processing of the workpiece.

* * * * *